United States Patent
Posamentier

(10) Patent No.: US 7,411,533 B2
(45) Date of Patent: Aug. 12, 2008

(54) ADC FOR SIMULTANEOUS MULTIPLE ANALOG INPUTS

(75) Inventor: Joshua Posamentier, Oakland, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/544,528

(22) Filed: Oct. 5, 2006

(65) Prior Publication Data

US 2008/0084344 A1    Apr. 10, 2008

(51) Int. Cl.
*H03M 1/12* (2006.01)
(52) U.S. Cl. ...................... 341/122; 341/155
(58) Field of Classification Search .............. 341/122, 341/123, 141, 155; 702/104, 105, 106, 107
See application file for complete search history.

(56) References Cited

U.S. PATENT DOCUMENTS

| | | | | |
|---|---|---|---|---|
| 4,933,676 A | * | 6/1990 | Hauge et al. | 341/141 |
| 6,441,896 B1 | * | 8/2002 | Field | 356/222 |
| 6,788,235 B1 | * | 9/2004 | Barrenscheen et al. | 341/155 |
| 7,068,195 B1 | * | 6/2006 | Menkus | 341/141 |
| 2005/0225469 A1 | * | 10/2005 | White | 341/155 |

* cited by examiner

*Primary Examiner*—Howard Williams
(74) *Attorney, Agent, or Firm*—John F. Travis

(57) ABSTRACT

In a multi-channel analog-to-digital converter (ADC), in which the ADC sequentially converts analog values that are input from different analog sensors, separate sample-and-hold circuits may be used to read all the analog values at the same time, and the ADC may then sequentially convert the values from each sample-and-hold circuit. This approach allows a single ADC to be used in time-critical applications that require all the analog sensor values to be measured at the same time.

19 Claims, 4 Drawing Sheets

ADC FOR SIMULTANEOUS MULTIPLE ANALOG INPUTS

BACKGROUND

Many types of sensors must have their analog outputs converted to digital values so the sensor readings may be processed in a digital computer. When multiple sensors of the same type are being used (for example, audio inputs from multiple microphones in different parts of a room), a single analog-to-digital converter (ADC) may be used for all of them by using a multiplexer to select and sample each sensor at different times. By successively sampling and converting the output of each sensor in turn, every sensor may be sampled at reasonable intervals, while still using only using a single precision (and expensive) ADC. However, when the instantaneous difference between inputs from different sensors is important (e.g., determining the originating point of the sound based on the time it takes the sound to reach each microphone), this sequential sampling technique can produce significant errors in the final result. Providing a separate ADC for each sensor may bring improvement, but at a substantial increase in cost.

BRIEF DESCRIPTION OF THE DRAWINGS

Some embodiments of the invention may be understood by referring to the following description and accompanying drawings that are used to illustrate embodiments of the invention. In the drawings.

DETAILED DESCRIPTION

Figure 1:
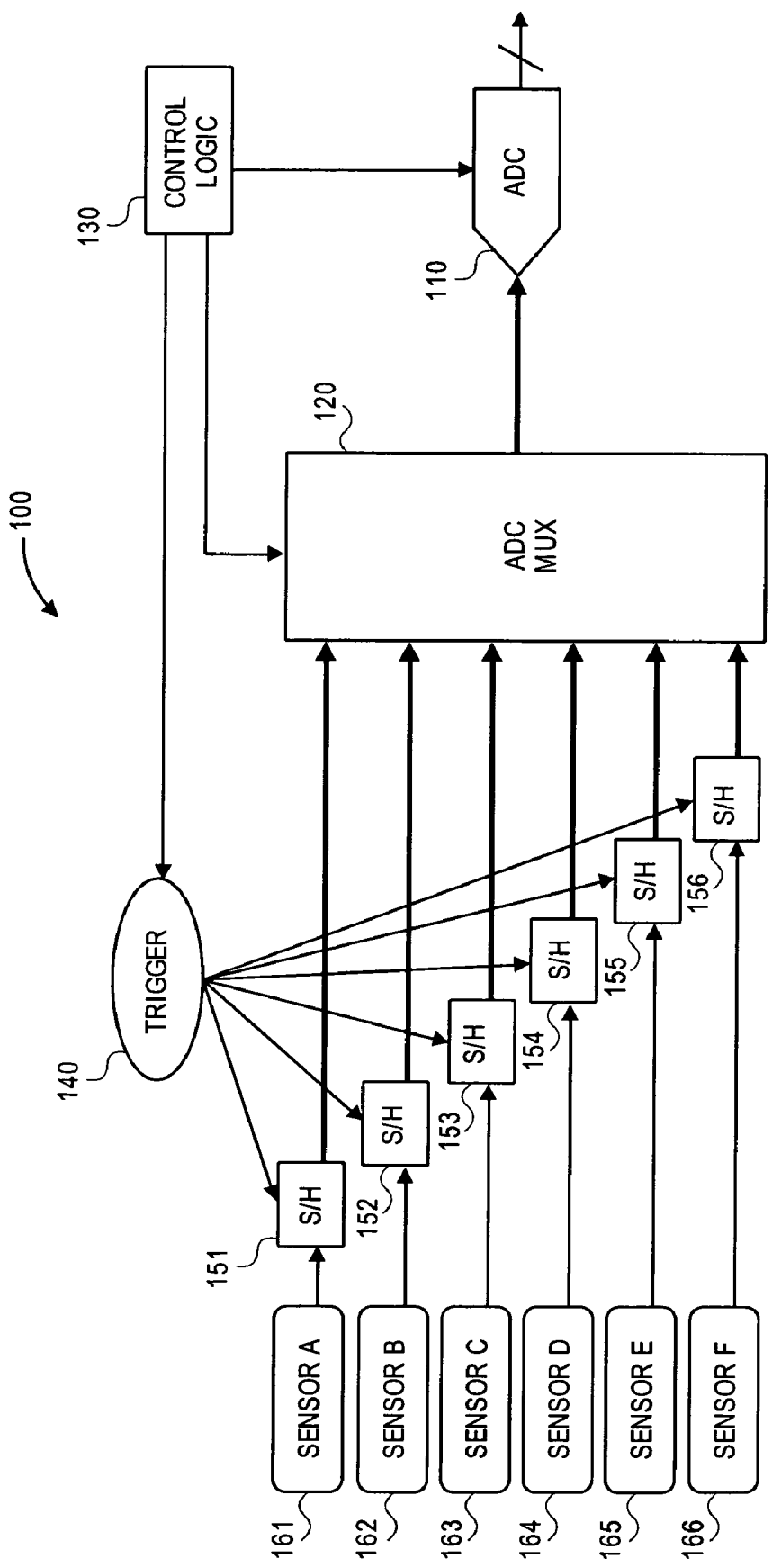
FIG. 1 shows a sensor network with a multiplexed ADC, according to an embodiment of the invention.

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements co-operate or interact with each other, but they may or may not be in direct physical or electrical contact.

As used in the claims, unless otherwise specified the use of the ordinal adjectives "first", "second", "third", etc., to describe a common object, merely indicate that different instances of like elements are being referred to, and are not intended to imply that the elements so described must be in a given sequence, either temporally, spatially, in ranking, or in any other manner.

The term "wireless" and its derivatives may be used to describe circuits, devices, systems, methods, techniques, communications channels, etc., that communicate data by using modulated electromagnetic radiation through a non-solid medium. The term does not imply that the associated devices do not contain any wires, although in some embodiments they might not.

Various embodiments of the invention may be implemented in one or any combination of hardware, firmware, and software. The invention may also be implemented as instructions contained in or on a machine-readable medium, which may be read and executed by one or more processors to enable performance of the operations described herein. A machine-readable medium may include any mechanism for storing, transmitting, and/or receiving information in a form readable by a machine (e.g., a computer). For example, a machine-readable medium may include a storage medium, such as but not limited to read only memory (ROM); random access memory (RAM); magnetic disk storage media; optical storage media; a flash memory device, etc. A machine-readable medium may also include a propagated signal which has been modulated to encode the instructions, such as but not limited to electromagnetic, optical, or acoustical carrier wave signals.

Some embodiments of the invention use multiple analog sample-and-hold circuits to simultaneously sample the analog outputs of multiple sensors. The analog voltages in these multiple sample-and-hold circuits may then be sequentially read by an ADC. Although the ADC may be sampling and converting the various analog values at different times, the values represent measurements that were all taken at the same time. Thus any processing that relies on simultaneously acquired sensor readings may be able to accurately process that data.

FIG. 1 shows a sensor network with a multiplexed ADC, according to an embodiment of the invention. In the illustrated network 100, each of multiple sensors 161-166 may provide its analog output to a corresponding analog sample-and-hold (S/H) circuit 151-156. In some embodiments all of the sensors 161-166 may be of the same type, but other embodiments may mix different types of sensors. Each S/H circuit may take a sample of the respective sensor's analog voltage when the S/H circuit receives a signal from trigger circuit 140, and hold that sample for a period of time. In some embodiments the S/H circuit may store the analog voltage in a capacitor, but other embodiments may use other techniques. Analog sample-and-hold circuits are well known and are not described here in more detail to avoid obscuring a description of the various embodiments of the invention. In some embodiments all S/H circuits 151-156 may be triggered by a common trigger signal, and therefore all may sample their respective analog voltages at the same time, and then retain those analog voltages without significant degradation until the voltages have been read by the ADC.

Analog multiplexer 120 may select any single S/H circuit and provide its analog value to ADC 110, which may then convert that analog value to its digital equivalent for presentation to a digital circuit (not shown). The number of bits in the digital value may depend on the precision provided by the ADC. In some embodiments the different S/H circuits may be read sequentially. In the context of this document, 'sequentially' indicates that the different S/H circuits are read separately and at different times. It does not imply that the S/H circuits must be read in a particular order, or that the readings must be spaced at particular intervals, although these possibilities are not excluded, either.

Control logic 130 may serve several purposes. It may initiate a triggering event by trigger circuit 140. Such triggering events may be in response to any feasible cause, such as but not limited to: 1) a request for a measurement by a computer system, 2) a repetitive event set to occur at predetermined intervals, 3) a signal from one or more sensors that there is fresh data available, 4) etc. Control logic 130 may also cause multiplexer 120 to successively select each of the S/H circuits in turn. Control logic 120 may also send timing signals to ADC 110 to tell the ADC when to perform a conversion.

Figure 2:
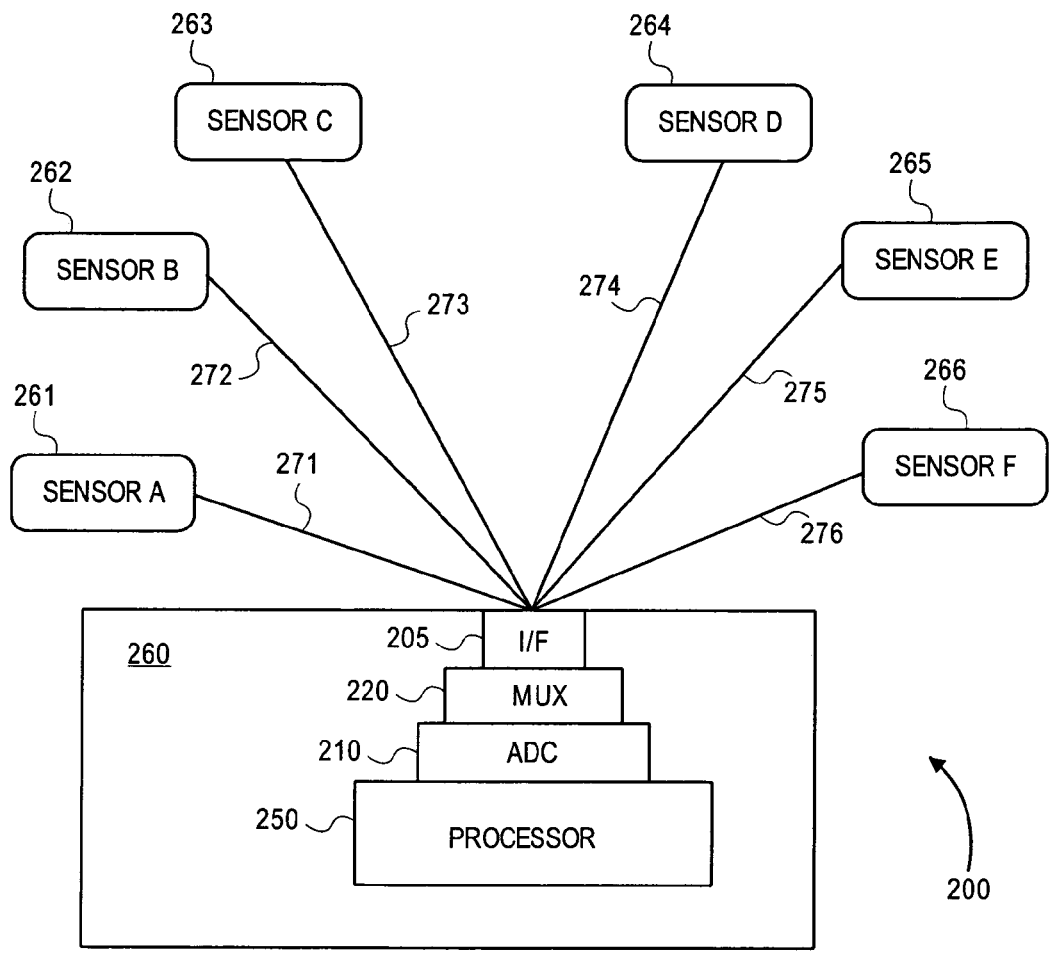
FIG. 2 shows a sensor network with a computer system, according to an embodiment of the invention.

FIG. 2 shows a sensor network with a computer system, according to an embodiment of the invention. The illustrated computer system 260 may be used to process the readings from the various sensors, and in some embodiments may communicate with other computer systems (not shown). The computer system 260 may include such things as a processor 250, an ADC 210 to convert sensor values from analog to digital format, a multiplexer 220 to select one of the available sensor values for conversion by the ADC, and an interface 205 to receive the analog sensor values from the sensors. Sensor devices 261-266 may communicate their analog values to the interface over communication links 271-276. In some embodiments the ADC, multiplexer, and sensors of FIG. 1 may approximately correspond to their counterparts in FIG. 2. Although six sensors are shown in both figures, various embodiments may include any feasible number of sensors that share a multiplexer. In some embodiments the computer system may include more than one interface and/or multiplexer and/or ADC.

Depending on the technology used and other factors, the sample-and-hold circuit for each sensor may be co-located with the sensor device or with the computer system, and in some embodiments the sample-and-hold circuits, the sensors, and the computer system may all be co-located. In any case, communications links 271-276 may be of any feasible technology, either wired or wireless, that is able to convey analog values with the required precision without first converting those analog values to digital values. Such communication links may be, but are not limited to, such technologies as: 1) a cable connection, 2) a wireless communications channel, 3) a short electrical connection such as a trace on a printed circuit board, 4) a shared media, such as a bus or a shared radio channel, 5) a combination of one or more of these, 6) etc. In some embodiments where there is a predictable or measurable amount of loss of the analog value during the transmission for a given sensor, the computer system may correct for that loss after reception, either when the value is still in its analog form or after it has been converted to digital form. This may be especially important if different communications links suffer from different amounts of loss. Such corrections may also be used to calibrate the readings from different sensors to account for differences caused by other factors (e.g., manufacturing tolerances in the sensor devices).

If the sample and hold circuit is located at the sensor device, communicating a trigger signal from the computer system to the sensor device may use any feasible technology, and in some embodiments may use the same communications link that is used for communicating analog values from the sensor device to the computer system. In some embodiments a signal with a sharp point of reference may be broadcast to all the relevant sensor devices (i.e., sent simultaneously to all sensor devices). Examples may include a pulse sent to all the sensor devices, a stroboscopic flash of light sent to all the sensor devices, etc. In other embodiments, a future time to sample the analog reading may be transmitted to each sensor device, and the sensor device may then take the sample at the indicated time. In such embodiments the sensor devices may be required to have internal clocks that are synchronized to a common time reference with a high degree of accuracy.

If differences in the time a trigger signal takes to travel to each sensor device is important (for example, because some sensor devices are much farther away than others), then adjustments may be made to correct for these differences so that each S/H circuit takes a sample at the same time. In some embodiments, the timing of each separately-transmitted trigger signal may be adjusted so that all trigger points will arrive at their respective sensor devices at the same time. In other embodiments, each sensor device may have been individually instructed to delay the sampling operation by a pre-determined time after receiving the trigger signal, so that all sensor devices will take a sample reading at the same time.

In applications-in which the S/H circuits are co-located with the computer system, the time it takes the analog value to reach the S/H circuit may likewise vary with the distance to the sensor device. If this time difference is enough to be important, the timing of the trigger signal may be adjusted for each S/H circuit, so that the sample readings for all the sensor devices will represent analog values that were generated by the sensors at the same time.

Various embodiments of the invention may be used in various types of sensor networks. Such sensor networks may include, but are not limited to, such things as: 1) vibration sensors used in monitoring structural vibration and/or mechanical stress in structures, 2) seismic sensors to monitor earthquakes or other underground vibrations, or to perform underground mapping, 3) location determination based on triangulation of signals from multiple sources, 4) wavefront propagation measurements, 5) etc.

Figure 3:
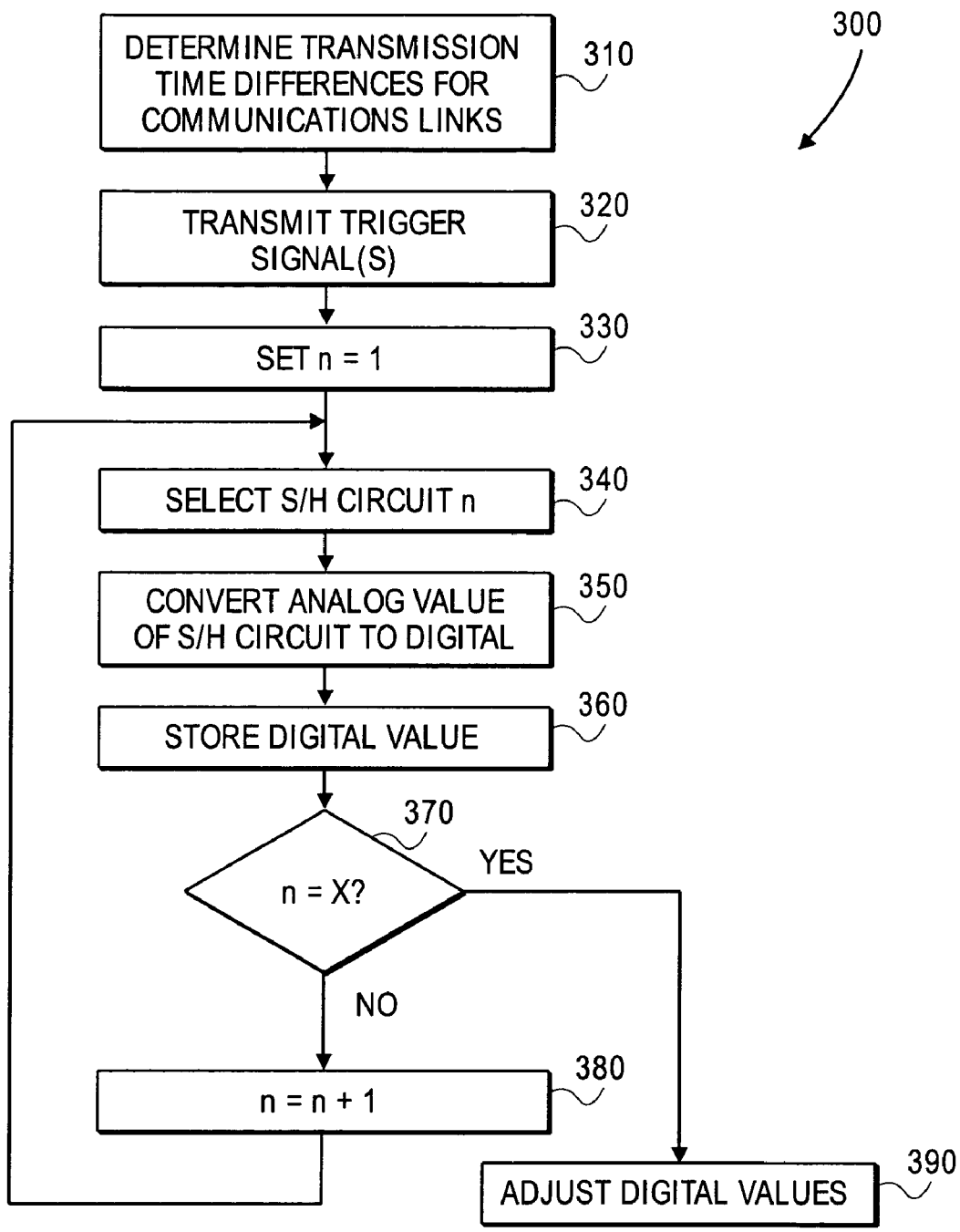
FIG. 3 shows a flow diagram of a method, according to an embodiment of the invention.

FIG. 3 shows a flow diagram of a method, according to an embodiment of the invention. In the illustrated embodiment of flow diagram 300, at 310 a computer system may determine differences in transmission time for the various communications links between the computer system and multiple sensor devices. Any feasible means may be used to determine these differences, such as but not limited to: 1) calculating values based on physical distances and/or transmission mediums, 2) performing timing tests, 3) looking up the values in an existing table, 4) etc. If the differences are not significant enough to matter, or if such differences are already set in the equipment, operation 310 may be skipped. At 320, one or more trigger signals may be transmitted, causing all S/H circuits to simultaneously take a sample of the analog value of their associated sensors. If relevant, the timing of the different trigger signals may be adjusted based on the differences determined at 310.

At 330 and 340 the first S/H circuit may be selected for analog-to-digital conversion by setting a counter n=1 and selecting S/H circuit n. In some embodiments this selection may be done using a multiplexer as previously described. Once selected, that S/H circuit's stored analog value may be converted to a digital value with an ADC at 350, and that digital value may be stored for subsequent use at 360 (or in some embodiments may be immediately transferred to another device for subsequent use). At 370 it may be determined if this is the last S/H circuit to be selected, with X being the number of S/H circuits to be read in a single session. If not, n is incremented at 380 and operations 340-360 are repeated for the next S/H circuit. If yes, then the various digitized values may be processed. In some embodiments, such post-conversion processing may include adjusting the digital values at 390 to compensate for known errors in the analog processing. For example, different analog sensors may provide slightly different readings for the same sensed condition, and different sample-and-hold circuits may provide slightly different outputs for the same inputs. Similarly, different communications paths may provide different levels of loss or distortion in the analog signals. All of these may be corrected by adjusting the digital values, if the amount of such correction is known or can be estimated.

Although a software method of sequentially selecting each S/H circuit is illustrated in FIG. 3 (i.e., the use of a counter value), other embodiments may achieve the same results using hardware, firmware, or other techniques for the selection process.

Figure 4:
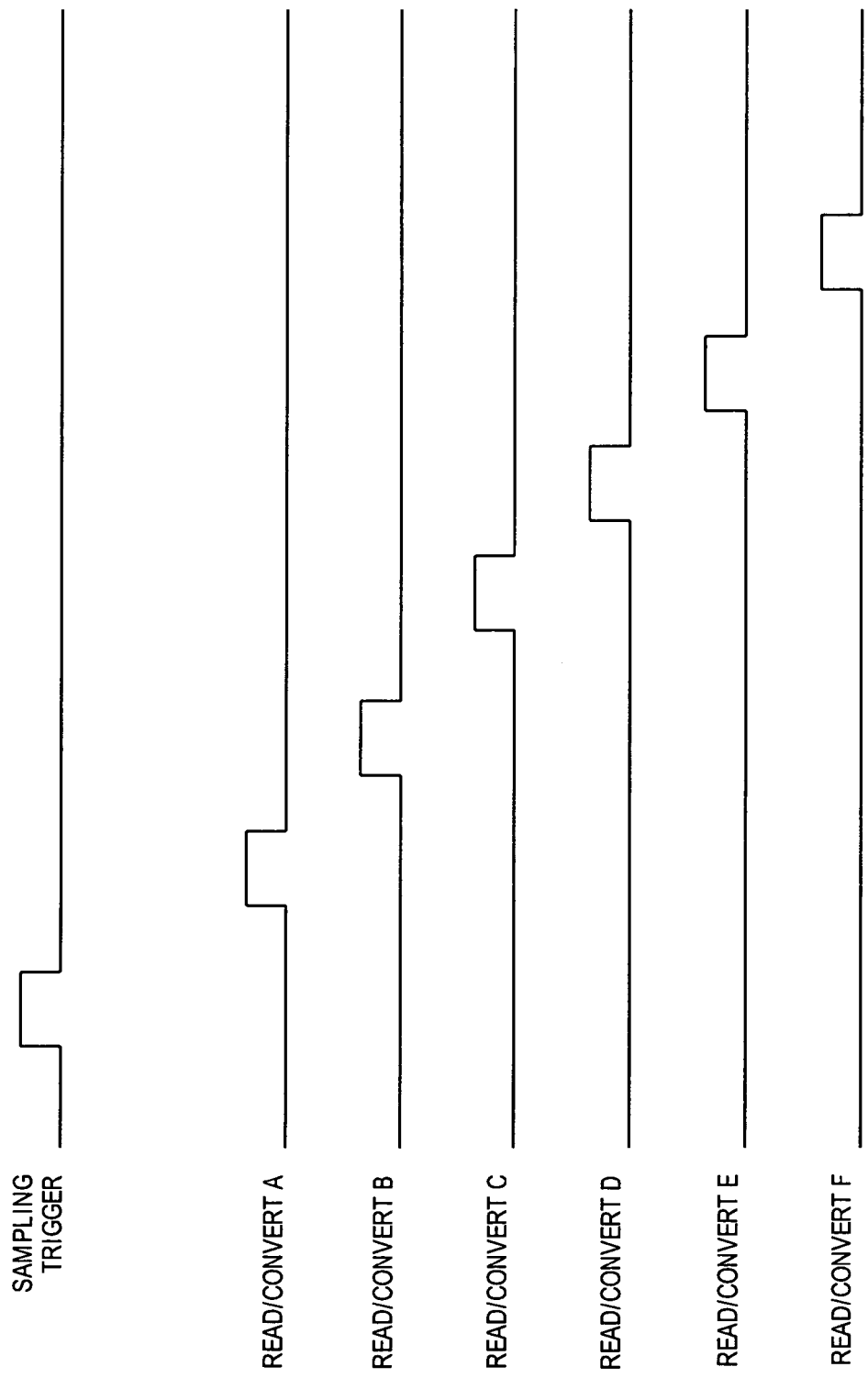
FIG. 4 shows a timing diagram of a sensor reading cycle, according to an embodiment of the invention.

FIG. 4 shows a timing diagram of a sensor reading cycle, according to an embodiment of the invention. In the illustrated embodiment, a trigger signal may first be transmitted to all sensors. A single pulse is shown, but in other embodiments the trigger signal may take other forms as previously described. After the trigger signal causes all sample-and-hold circuits to store the analog value received from their associated sensors, the sample and hold circuits may then be separately, and sequentially, read by an ADC and converted into the equivalent digital values. As shown, first the contents of a sample-and-hold circuit associated with sensor A is read and converted to a digital value. Once that conversion is complete, the same process may be used on the sample-and-hold circuit for sensor B, followed in turn by the sample-and-hold circuits for sensors C, D, E, and F.

The foregoing description is intended to be illustrative and not limiting. Variations will occur to those of skill in the art. Those variations are intended to be included in the various embodiments of the invention, which are limited only by the spirit and scope of the following claims.

What is claimed is:

1. An apparatus, comprising:
   an analog-to-digital converter (ADC);
   an analog multiplexer coupled to the ADC to select one of multiple analog signal sources for an input of the ADC;
   a trigger signal generator to cause multiple sample-and-hold circuits to each sample a separate analog signal from a separate analog sensor at a same time; and
   a control circuit coupled to the trigger signal generator and to the ADC to control timing of at least one trigger signal to the sample-and-hold circuits;
   wherein the control circuit comprises circuitry to adjust timing of the at least one trigger signal to compensate for different transmission times from the different analog sensors;
   wherein the ADC is to sequentially select each sample-and-hold circuit to convert an analog voltage from each sample-and-hold circuit to a corresponding digital value subsequent to said sampling.

2. The apparatus of claim 1, further comprising the sample-and-hold circuits.

3. The apparatus of claim 1, further comprising an interface to receive analog values associated with the analog sensors through at least one communications link.

4. The apparatus of claim 3, wherein the at least one communications link comprises a link selected from a list consisting of: a) a separate wired link for each sensor device, b) a wired bus shared by the sensor devices, c) a separate wireless channel for each sensor device, and d) a wireless channel shared by the sensor devices.

5. The apparatus of claim 1, further comprising a processor.

6. A system, comprising:
   a processor;
   an analog-to-digital converter (ADC) coupled to the processor;
   an analog multiplexer coupled to the ADC; and
   a control circuit coupled to the ADC, the control circuit to generate at least one signal to cause multiple sample-and-hold circuits to simultaneously each read an analog value from an associated analog sensor and hold the analog sensor value for subsequent conversion to a digital value by the ADC;
   wherein the control circuit is further to compensate for different transmission times from the different sensors.

7. The system of claim 6, further comprising the analog sensors and the sample-and-hold circuits.

8. The system of claim 7, wherein the analog sensors are electrically coupled to the sample-and-hold circuits, and the sample-and-hold circuits are coupled to the analog multiplexer through at least one communications link.

9. The system of claim 7, wherein the sample-and-hold circuits are electrically coupled to the analog multiplexer, and the analog sensors are coupled to the sample-and-hold circuits through at least one communications link.

10. The system of claim 7, wherein the sample-and-hold circuits are electrically coupled to the analog multiplexer, and the analog sensors are electrically coupled to the sample-and-hold circuits.

11. A method, comprising:
    transmitting at least one signal to multiple sample-and-hold circuits to cause each sample-and-hold circuit to simultaneously sample associated analog sensor values;
    adjusting the at least one signal to compensate for differences in transmission time from each sensor to the associated sample-and-hold circuit; and
    sequentially reading and converting a sampled analog voltage in each sample-and-hold circuit to a digital value with a single analog-to-digital converter.

12. The method of claim 11, wherein said transmitting comprises transmitting a pulse.

13. The method of claim 11, wherein said transmitting comprises transmitting a value of a future time to sample.

14. The method of claim 11, wherein said reading comprises using a multiplexer to select each sample-and-hold circuit.

15. The method of claim 11, further comprising adjusting the digital values to compensate for inaccuracies in received analog values.

16. An article comprising
    a tangible machine-readable medium that contains instructions, which when executed by one or more processors result in performing operations comprising:
    transmitting at least one signal to multiple sample-and-hold circuits to cause all the multiple sample-and-hold circuit to simultaneously sample associated analog sensor values; and
    sequentially reading and converting a sampled analog voltage in each sample-and-hold circuit to a digital value with a single analog-to-digital converter
    wherein the operation of transmitting comprises transmitting a value of a future time to sample.

17. The article of claim 16, wherein the operations further comprise controlling a multiplexer to separately select each of the sample-and-hold circuits.

18. The article of claim 16, wherein the operation of transmitting comprises adjusting timing of the at least one signal to compensate for differences in transmission time to each sensor.

19. The article of claim 16, wherein the operations further comprise adjusting at least one of the digital values to compensate for at least one parameter selected from a list consisting of: 1) differences in accuracy of different sensors, 2) differences in accuracy of different sample-and-hold circuits, and 3) differences in accuracy caused by transmission losses in the analog signals.

* * * * *